United States Patent [19]

Hazaki et al.

[11] Patent Number: 5,446,315
[45] Date of Patent: Aug. 29, 1995

[54] RESIN-SEALED SEMICONDUCTOR DEVICE CONTAINING POROUS FLUOROCARBON RESIN

[75] Inventors: Yoshito Hazaki; Minoru Hatakeyama; Sunao Fukutake; Akira Urakami, all of Okayama, Japan

[73] Assignee: Japan Gore-Tex, Inc., Japan

[21] Appl. No.: 182,520

[22] Filed: Jan. 11, 1994

Related U.S. Application Data

[63] Continuation of Ser. No. 841,685, Feb. 26, 1992, abandoned.

[30] Foreign Application Priority Data

Mar. 8, 1991 [JP] Japan .................. 3-067530
Mar. 12, 1991 [JP] Japan .................. 3-070378

[51] Int. Cl.⁶ .................. H01L 23/36; H01L 23/02; H01L 23/12; H01L 39/02
[52] U.S. Cl. .................. 257/687; 257/682; 257/683; 257/702
[58] Field of Search .................. 357/72; 257/682, 683, 257/687, 702

[56] References Cited

U.S. PATENT DOCUMENTS

| | | | |
|---|---|---|---|
| 3,083,320 | 3/1963 | Godfrey et al. | 257/682 |
| 3,670,091 | 6/1972 | Frantz et al. | 257/786 |
| 4,888,634 | 12/1989 | Lai et al. | 357/72 |
| 4,933,744 | 6/1990 | Segawa et al. | 357/72 |
| 4,985,751 | 1/1991 | Shiobara et al. | 357/72 |
| 5,015,675 | 5/1991 | Walles et al. | 523/443 |
| 5,034,801 | 7/1991 | Fischer | 357/72 |
| 5,097,317 | 3/1992 | Fujimoto et al. | 357/72 |
| 5,117,272 | 5/1992 | Nomura et al. | 357/72 |
| 5,122,858 | 6/1992 | Mahulikar et al. | 357/70 |

FOREIGN PATENT DOCUMENTS

| | | | |
|---|---|---|---|
| 0186351 | 10/1984 | Japan . | |
| 0023348 | 1/1986 | Japan . | |
| 0015448 | 1/1988 | Japan | 357/72 |
| 0047958 | 2/1988 | Japan . | |
| 0207811 | 8/1988 | Japan . | |
| 0036056 | 2/1989 | Japan . | |
| 0208846 | 8/1989 | Japan . | |
| 0010858 | 1/1990 | Japan | 357/72 |
| 0178953 | 7/1990 | Japan . | |
| 0027557 | 5/1991 | Japan | 357/72 |
| 0125644 | 5/1991 | Japan . | |

Primary Examiner—William D. Larkins
Assistant Examiner—Valencia Martin Wallace
Attorney, Agent, or Firm—Gary A. Samuels

[57] ABSTRACT

A resin-sealed semiconductor device, including a chip mounting die pad, porous fluorocarbon material located just beneath the die pad, beneath a die-pad supporting layer, gold lead wires, or in a sealing resin surrounding the other components, wherein any water vapor generated by the heat of soldering will be held within the porous fluorocarbon rather than crack the sealant under internal pressure.

6 Claims, 2 Drawing Sheets

RESIN-SEALED SEMICONDUCTOR DEVICE CONTAINING POROUS FLUOROCARBON RESIN

This application is a continuation of application Ser. No. 07/841,685 filed Feb. 26, 1992, now abandoned.

FIELD OF THE INVENTION

The present invention relates to resin-sealed semiconductor apparatus and more specifically to preventing both the formation of cracks owing to the thermal stress inside the resin and the formation of cracks in the resin owing to water vapor pressure generated by rapid heating of the resin during solder mounting of the device.

BACKGROUND OF THE INVENTION

Owing to the gradual miniaturization of electron instruments and to their constant improvement in recent years, resin-sealed semiconductor devices wherein semiconductor chips are sealed with a resin, such as an epoxy resin, have become widely used as thin and compact semiconductor packages and other devices of the surface-mounted type.

Resin-sealed conventional semiconductor devices generally have a semiconductor chip mounted on a chip-mounting component commonly referred to as a die pad, the electrodes of the semiconductor chip and the inner leads connected by thin gold wires, the components sealed with an epoxy-based or other resin and subsequently connected to conductive leads and coated with solder.

Japanese provisionally published Patent Applications 61-23348 and 63-54757 show techniques for manufacturing such resin-sealed semiconductor devices, including machining the undersurfaces of the tabs to relieve stress.

However, a serious disadvantage of conventional resin-sealed semiconductor devices similar to that described above is their poor thermal resistance during solder mounting of the package. Specifically, since vapor phase fellow soldering or infrared heating are generally used as the method for solder mounting of these semiconductor packages on printed circuit boards (PCB) and the like, not only the components to be joined by soldering but also the packages themselves are rapidly heated during such solder mounting and the water which is absorbed in the bulk of the resin and which has penetrated the semiconductor device during storage rapidly evaporates owing to said heating. The vapor generated diffuses along the interface either between the resin and the chip-mounting component or between the resin and the semiconductor chip. The components become detached from each other, and the vapor penetrates between the detached portions, increases its internal pressure, and causes cracks in the resin to form. Such crack formation becomes especially noticeable in compact and thin semiconductor devices. A resin, such as an epoxy resin, absorbs moisture during the period of storage which follows manufacture but precedes soldering. With formation of cracks, the resin-sealing effect is considerably reduced and the performance and life span of semiconductor devices are severely impaired.

Although the techniques proposed in the above Japanese provisionally published applications 61-23348 and 63-54757 are effective in preventing cracks from being formed on the lower surfaces of chip-mounting elements, these techniques do not prevent the formation of cracks on the upper and lateral surfaces, which cause wire breakage and other failures fatal to semiconductor devices. Additional disadvantages include a larger number of operations and higher production costs caused by the machining of the reverse surfaces of the elements.

SUMMARY OF THE INVENTION

The present invention provides a means for securely preventing resin cracks from being caused both by abrupt thermal stress during solder mounting and by the accompanying generation of water vapor even in resin-sealed layers made into compact and thin layers.

The invention comprises a resin-sealed semiconductor device which comprises a semiconductor element mounted on a chip-mounting component, a porous fluorocarbon body located either on at least a portion of the lower surface of the chip-mounting component or small pieces of porous fluororesin incorporated into a sealant surrounding the components as a unit.

By installing a porous fluorocarbon body on the lower surface of a chip-mounting component and installing a semiconductor element on the mounting component, and by sealing these two components with a resin sealant, the vapor that is generated by rapid heating during solder mounting is caused to diffuse into the porous body, an internal pressure rise is avoided, and the formation of cracks is prevented.

Where small pieces of porous fluororesin are incorporated into the molding resin, the stress caused by the pressure of the water vapor generated inside said resin designed for molding is absorbed by the small pieces of porous fluororesin and the formation of cracks is prevented. Even when cracks have been formed, the spreading of the cracks can be deterred by the small pieces of porous fluororesin. By using small pieces of porous fluororesin, it becomes possible to suitably absorb the thermal stress and to lower the internal stress caused by rapid heating during solder mounting because the porous resin pieces display low elasticity and excel in stress relaxation.

The small pieces of porous fluororesin measure 1 to 500 microns and preferably 10 to 100 microns, and have a porosity of 20 to 90%, and preferably 60 to 80%. The pieces are used in an amount (in terms of volume) of 5 to 90% with respect to the sealing resin layer. Further, the small pieces of porous fluororesin are positioned evenly throughout the sealing resin, ensuring that the semiconductor device is rendered more compact and flat.

In addition, the chip-mounting component can have supporting extensions. Where a porous fluorocarbon body is installed on the lower surface of the supporting portion, the vapor diffused in by the heat of soldering is allowed to reach the supporting portion, is allowed to pass through the interface between the supporting portion and the sealing resin, and is discharged to the outside of the sealed component, thereby dispersing an increase in the pressure inside the package and preventing the formation of cracks.

By using a porous fluorocarbon body which displays low elasticity and is excellent in stress relaxation, it becomes possible to suitably absorb the thermal stress and to lower the internal stress, which are caused by rapid heating during solder mounting.

DETAILED DESCRIPTION OF THE INVENTION

The invention is now described in terms of the drawings to more clearly delineate the scope and important details of the invention.

The porous fluorocarbon body has a pore diameter of about 0.1 to 2 microns, preferably 0.5 to 1.2 microns and a porosity of 30 to 90%, preferably 50 to 80%. The porous fluorocarbon resin body can usually be shaped as a thin layer, so that even when the porous body is secured to the bottom surface of the chip-mounting component and is stably positioned inside a resin sealing component, it is still possible to make a semiconductor device more compact and flat by suitably shaping the resin coating on said components in the form of a thin layer.

The porosity and the pore diameter of the porous fluorocarbon body can be calculated from the ethanol bubble point and the density by methods such as ASTM-F316.

Ethanol Bubble Point (EBP)

Ethanol was spread over the surface of the material (film) sample, the sample placed horizontally on a fixing apparatus, and the EBP measured. Here, air was blown from below the sample. The EBP is the initial pressure ($kg/cm^2$) at the point air bubbles are continuously exiting from the surface on the reaction side. The average pore diameter can be calculated from the EBP by a method, such as ASTM-F316.

Porosity

The porosity of the polymer film prior to impregnation was obtained by measuring the density of the material. The density of the material (polytetrafluoroethylene) was 2.2 $g/cm^3$. The porosity was calculated using the equation:

Porosity=(2.2−sample density): 2.2×100

Figure 1:
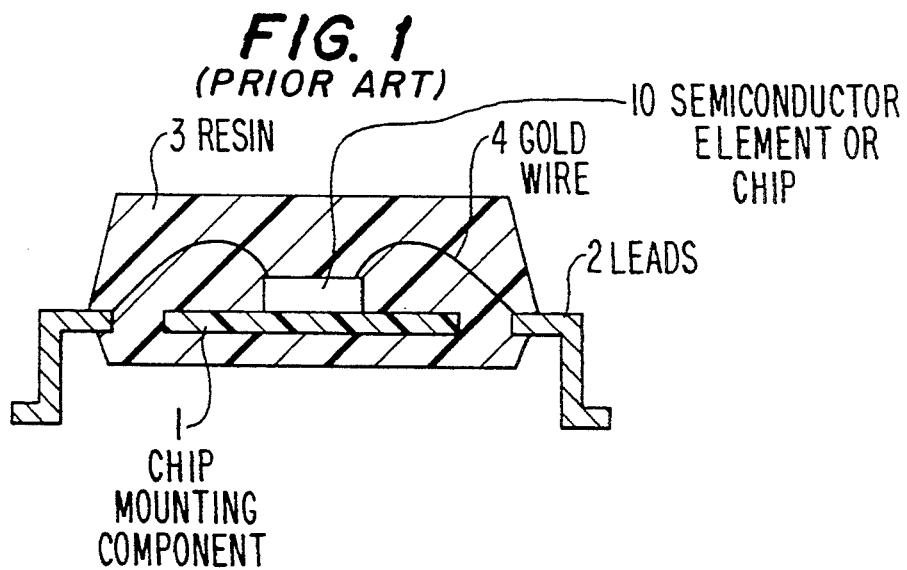
FIG. 1 is a cross-sectional view of a semiconductor chip mounted on a die pad, connected by wire leads to electrodes, and the components surrounded by a resin seal in the conventional manner.
Figure 2:
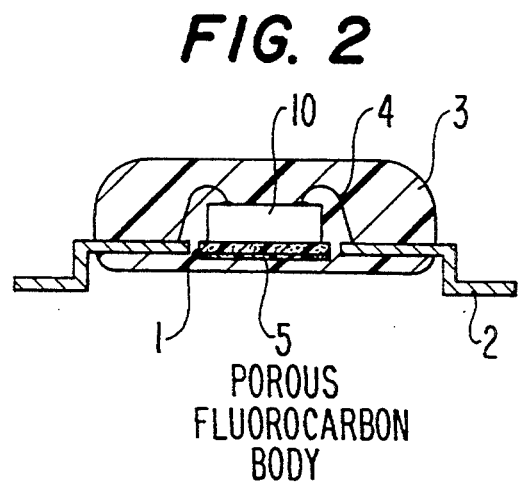
FIG. 2 is a cross sectional view of a device of the invention wherein the semiconductor chip thereof rests on a chip support layer, which in turn rests on a layer of porous fluorocarbon.
Figure 3:
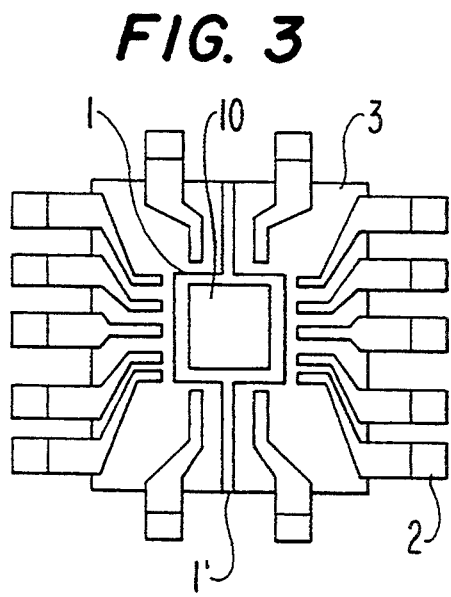
FIG. 3 is a top view of a device of the invention.

In a conventional mounting of a semiconductor device as shown in FIG. 1, a semiconductor element or chip 10 is mounted on a chip-mounting component 1 and the electrodes of the semiconductor chip connected to leads 2 by means of thin gold wires 4, which have excellent electrical characteristics. In the present invention, however, a porous fluorocarbon body 5 is additionally installed either on the bottom surface of a supporting portion 1' or on the bottom surface of the chip-mounting portion of a chip-mounting component 1, as shown in FIG. 2, ensuring that lead formation and solder coating are conducted in a suitable manner because the resin 3 encloses entirely and seals such a chip-mounting portion and porous fluorocarbon body 5. A fluorocarbon body that is rendered porous by subjecting a poly(tetrafluoroethylene) film to an expansion (drawing) treatment is preferable as the porous fluorocarbon body 5. The porosity obtained should be 30 to 90%, and should preferably be about 50 to 80%.

Fine pores in the body do not transmit some liquids such as water, but transmit most organic liquids such as the usual organic solvents.

In case of epoxy resin, it is precluded from penetrating inside body 5 because of its high viscosity and the air enclosed into the fine pores in the body. In order to penetrate such viscous liquid into such fine pores, impregnation of any liquid having permeability into the pores and miscibility with the viscous liquid is first done, then the first liquid is replaced with the viscous liquid. In the present invention, the above mentioned process is not conducted for the fine pores to be able to hold the air through which vapor can pass.

However, the porous fluorocarbon body 5 is not limited to only expanded polytetrafluoroethylene (PTFE) and may also be a continuous foamed body of fluorocarbon. Further, nonwoven or woven fabric manufactured from a fluorocarbon fiber may be used. The body 5 may be a product obtained by including an inorganic filler in a porous body. Especially preferable fillers are glass, quartz, titanium dioxide, barium titanate, and calcium titanate because of their excellent thermal conductivity.

In addition to PTFE, tetrafluoroethylene-hexafluoropropylene copolymers (FEP), polychlorotrifluoroethylene (PCTFE), perfluoroethylene-perfluoroalkyl vinyl ether copolymers (PFA), and ethylene-tetrafluoroethylene copolymers (ETFE) can be used as the fluorocarbon, for example.

Since the porous fluorocarbon 5 in FIG. 2 always has low elasticity and high porosity, the water vapor that is generated by the rapid heating during solder mounting is dispersed throughout the structure. The low elasticity plays an important part in absorbing thermal stress. The internal stress caused by heat is thus alleviated, thereby preventing cracks from forming in sealing resin 3. Therefore, it is possible to provide semiconductor chips with characteristics that are stable over a long period of time.

As an example, eight samples of each of two types of device were prepared. In the first type of device that pertains to the present invention, an epoxy adhesive was applied to the outer surface of porous fluorocarbon 5 which was an expanded porous PTFE film that had a thickness of 50 microns, a porosity of 80%, and a maximum pore diameter of 1 microns. In the second type of device, conventional devices without the porous fluorocarbon body 5 were used. The test pieces were first caused to absorb moisture for 72 hours in an atmosphere at a temperature of 85° C. and a humidity of 85% and were then immersed in a solder bath for ten seconds. The presence of cracks formed in the packages was investigated. The results showed that, whereas no cracks whatsoever were formed in the examples pertaining to the present invention, the formation of cracks was detected in all the conventional examples under the rigorous testing conditions similar to those described above.

Figure 4:
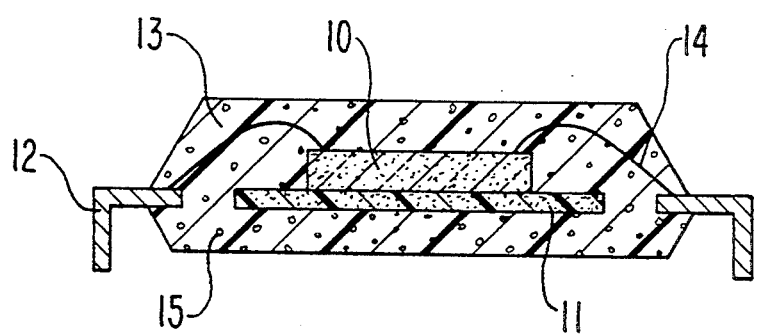
FIG. 4 is a cross-sectional view of a device of the invention wherein small pieces of fluororesin are incorporated into the sealant.

Specific embodiments of the invention are now described wherein small pieces of porous fluororesin are incorporated into the molding resin surrounding the electional components. As shown in FIG. 4, a semiconductor chip 10 is mounted on a chip-mounting element 11 and the electrodes of chip 10 connected to leads 12 by means of thin gold wires 14 in the same manner as conventional devices. In the present invention, the circumference of the chip-mounting element 11 is enclosed and sealed by a molding resin 13 which contains small pieces 15 of a porous fluororesin. Small pieces of fluororesin 15 that have been rendered porous by subjecting the resin, such as polytetrafluoroethylene, for example, to a drawing treatment or to a treatment with a foaming agent in the case of a thermoplastic fluororesin, are preferred. The size of the pieces are 1 to 500 microns (preferably 10 to 100 microns) of a porosity of 20 to 90% (preferably 60 to 80%) (calculated from the density of the resin). Even in cases when pieces 15 are incorporated into the molding resin 13 in an amount of 5 to 90% by volume, the fine pores, although transmitting vapor and other gases, do not transmit liquids, thereby precluding the resin from penetrating inside the porous structure of the particles. The fine pores are retained unchanged. Therefore, the vapor that is generated by rapid heating during solder mounting is effectively absorbed in these fine pores.

The small pieces 15 of porous fluororesin are not limited to porous polytetrafluoroethylene but may also be fluororesin foams or filled porous resins containing an organic filler, for example. Especially preferable fillers are glass, quartz, titanium oxide, barium titanate, and calcium titanate because of their excellent thermal conductivity.

In addition to porous polytetrafluoroethylene (PTFE), tetrafluoroethylene-hexafluoropropylene copolymers (FEP), poly(chlorotrifluoroethylene) (PCTFE), perfluoroethylene-perfluoroalkyl vinyl ether copolymers (PFA) and ethylene-tetrafluoroethylene copolymers (ETFE) can be used as the fluororesins.

Epoxy resins, polyimide resins, bismaleimide triazine resins (BT resins) and other resins compatible with fluororesins may be used as the molding resins. However, the use of epoxy resins and polyimide resins is preferable.

Since the small pieces of a porous fluororesin that are incorporated into the molding resin as described above always have low elasticity, internal stress is alleviated and absorbed even during the application of thermal stress after rapid temperature changes and moisture absorption in the course of solder mounting, making it possible to prevent, in a suitable and secure manner, the formation of cracks in the molding resin. Therefore, it is possible to provide semiconductor chips with characteristics that are stable over a long period of time.

As an example, twenty samples of each of two types of device were prepared. In the first type of device that pertains to the present invention, 30 weight percent of the small pieces of porous PTFE of the size of 20 microns, a porosity of 70%, and a maximum pore diameter of 1 micron, were added to the molding resin. In the second type, conventional devices without the small pieces of porous fluororesin. The test pieces were first caused to absorb moisture for 72 hours in an atmosphere at a temperature of 85° C. and humidity of 85%. and were then rapidly heated at 260° C. at 30 seconds. The presence of cracks formed in the resin was determined. The results showed that no cracks whatsoever formed in the samples pertaining to the present invention. The formation of cracks was detected in 70% of the conventional samples under similar testing conditions.

When an epoxy resin was used as molding resin 13, the dielectric constant of the devices was 3.6 in conventional samples, but reached only 2.6 in the samples pertaining to the present invention, wherein 30 weight percent of the small pieces of porous fluororesin was added to the epoxy resin. The dielectric constant of the packages was then observed to be lowered.

Through the present invention it is possible to securely prevent crack formation by alleviating and absorbing in small pieces of porous fluororesin the stress that is created in a resin layer when vapor is generated or the temperature is changed as a result of rapid heating during solder mounting of a resin-sealed semiconductor device. It is also possible to suppress to a minimum the formation of cracks and to lower the dielectric constant, thereby ensuring, among other effects, an increase in the speed with which signals are transmitted in semiconductor devices. Additionally, the devices have relatively thin-layer films and manufacture is not complex or expensive.

We claim:

1. A resin-sealed semiconductor device consisting of:
   (a) a semiconductor chip mounted on a chip-mounting element;
   (b) a multiplicity of leads located on said chip-mounting element and connected to said chip by gold wire leads; and
   (c) a sealing resin containing small pieces of porous fluororesin surrounding as a unit said chip, said chip-mounting element, the interior ends of said leads, and said wire leads.

2. A device of claim 1 wherein said porous fluororesin is selected from the ground consisting of tetrafluoroethylene, tetrafluoroethylene copolymers of ethylene and hexafluoropropylene, polychlorotrifluoroethylene and perfluoroethylene-perfluoroalkyl vinyl ether copolymers.

3. A device of claim 2 wherein said sealing resin comprises and epoxy-based resin.

4. A device of claims 1 or 2 wherein said quantity of said fluororesin pieces comprises from 5 to about 90% by volume of said sealing resin.

5. A device of claims 1, 2 or 4 wherein said fluororesin has a porosity of about 20% to about 90%.

6. A device of claims 1, 2, 3, 4, or 5 wherein said porous fluororesin is filled with particulate inorganic material.

* * * * *